United States Patent
Sunwoo et al.

(10) Patent No.: US 6,617,751 B2
(45) Date of Patent: Sep. 9, 2003

(54) FILM BULK ACOUSTIC RESONATOR AND METHOD FOR FABRICATION THEREOF

(75) Inventors: Kuk Hyun Sunwoo, Kyungki-do (KR); Hyoung Jun Kim, Kyungki-do (KR); Jae Wook Jang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/837,376

(22) Filed: Apr. 19, 2001

(65) Prior Publication Data

US 2003/0006672 A1 Jan. 9, 2003

(30) Foreign Application Priority Data

Dec. 5, 2000 (KR) .......................................... 2000-73239

(51) Int. Cl.[7] .............................................. H01L 41/08
(52) U.S. Cl. ...................... 310/312; 29/25.35; 310/324; 427/100
(58) Field of Search ................................ 310/330, 324, 310/321, 312; 29/25.35; 427/100; 156/629–631, 633

(56) References Cited

U.S. PATENT DOCUMENTS

| | | | | |
|---|---|---|---|---|
| 3,486,046 A | * | 12/1969 | Zalar ............................ | 257/416 |
| 4,456,850 A | * | 6/1984 | Inoue et al. ................. | 310/324 |
| 4,642,508 A | * | 2/1987 | Suzuki et al. ................ | 310/321 |
| 4,672,354 A | * | 6/1987 | Kurtz et al. ..................... | 338/4 |
| 5,185,589 A | * | 2/1993 | Krishnaswamy et al. ... | 310/320 |
| 5,587,620 A | * | 12/1996 | Ruby et al. .................. | 310/312 |
| 5,692,279 A | * | 12/1997 | Mang et al. ................. | 29/25.35 |
| 5,873,154 A | | 2/1999 | Ylilammi et al. | |
| 5,884,378 A | * | 3/1999 | Dydyk ........................ | 29/25.35 |
| 6,051,907 A | | 4/2000 | Ylilammi | |
| 6,081,171 A | * | 6/2000 | Ella ............................. | 310/348 |
| 6,097,133 A | * | 8/2000 | Shimada et al. ............. | 310/328 |
| 6,131,256 A | * | 10/2000 | Dydyk et al. ............... | 29/25.35 |
| 6,198,208 B1 | * | 3/2001 | Yano et al. .................. | 310/358 |
| 6,278,342 B1 | * | 8/2001 | Ella ............................. | 310/321 |
| 6,377,137 B1 | * | 4/2002 | Ruby .......................... | 333/189 |
| 6,424,237 B1 | * | 7/2002 | Ruby et al. .................. | 333/187 |
| 6,456,173 B1 | * | 9/2002 | Ella et al. .................... | 333/188 |
| 6,480,074 B1 | * | 11/2002 | Kaitila et al. ................ | 333/188 |

* cited by examiner

*Primary Examiner*—Mark Osborne Budd
(74) *Attorney, Agent, or Firm*—Lowe Hauptman Gilman & Berner, LLP

(57) ABSTRACT

The present invention provides a robust FBAR device and a simplified method of fabricating a FBAR device. FBAR device according to the present invention includes a membrane supporting layer between a substrate and a membrane layer, surrounding an air gap region. The membrane supporting layer supports the membrane layer to obtain a robust structure. Firstly, the method forms a sacrificial layer on the substrate, then a photoresist pattern is formed on air gap forming region at a top surface of the sacrificial layer, the method removes the sacrificial layer to form a sacrificial pattern by using the photoresist pattern as an etching mask. An insulating material then deposits on the substrate, the photoresist pattern is remove, and a membrane layer is formed on a top surface of the sacrificial layer and the insulating material layer. Finally, the method removes the sacrificial pattern to form an air gap.

13 Claims, 6 Drawing Sheets

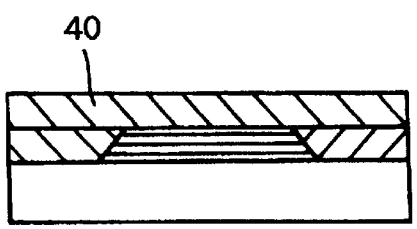
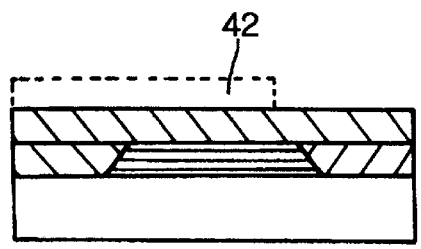
FIG. 2F  FIG. 2G
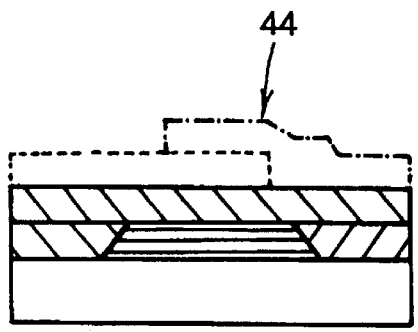
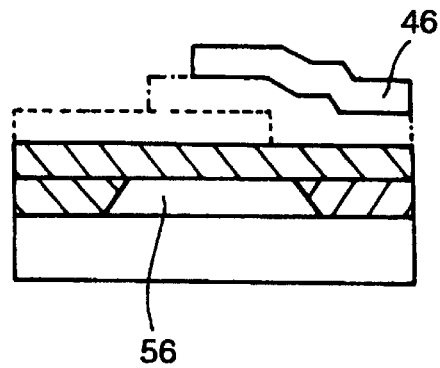
FIG. 2H  FIG. 2I

FILM BULK ACOUSTIC RESONATOR AND METHOD FOR FABRICATION THEREOF

BACK GROUND OF THE INVENTION

The present invention relates to Film Bulk Acoustic Resonator (FBAR) for thin film filter, and more particular to a FBAR device and a method of fabricating thereof, having robust structure and simplified process.

Recently, the development of an electrical communication technology has been accompanied by the development of signal processing technology and radio frequency (RF) device fabrication.

The need to reduce the cost and size of electronic equipment has led to a continuing need for smaller RF device. The miniaturization of RF device, such as FBAR device, has been accomplished through semiconductor process technology of fabricating a thin film.

The film bulk acoustic resonator (FBAR) device of various RF devices is a filter embodied by thin film type device, which has the piezoelectric material layer on wafer and can cause a resonance effect due to the piezoelectricity thereof.

Typically, the FBAR device comprises a first electrode, a piezoelectric layer and a second electrode, which are formed sequentially on a substrate, such as Si substrate. On applying electric field between the first electrode and the second electrode, the piezoelectric layer generates an acoustic wave. However, the acoustic wave must be separated from the substrate effect to maintain high quality factor (Q). Therefore, the FBAR device requires an isolation structure that separates the resonance region, including the first electrode, the piezoelectric layer and the second electrode, from the substrate, for preventing the acoustic wave from being irrupted by the substrate.

Thus, the performance of the FBAR device and the practicality of the fabrication method depend on how to fabricate such isolation structure.

In the recent FBAR devices, the isolating methods of separating the resonance region from the substrate include an air gap forming method using an etching cavity and a reflecting method using a Bragg reflecting film.

FIGS. 1A–1C illustrate cross-sectional structural views exemplary of a FBAR device structure in accordance with the prior method.

Referring to FIG. 1A, FBAR device according to the prior art comprises a Si substrate 10, a membrane layer 14, a first electrode 16, a piezoelectric layer 18 and a second electrode 20. Typically, the membrane layer includes $SiO_2$. In particular, the substrate has an etching cavity, which is formed by performing anisotropic etch to an etch stop. However, this FBAR structure is very weak and this method has low yield.

Referring to FIG. 1B, a FBAR device according to another air gap method is illustrated in FIG. 1B, which is also called as Air-Bridge method. This method comprises forming a sacrificial layer, which will be formed into air gap 12 in FIG. 1B, on a portion of the substrate surface 10, forming an insulator layer 14 on the substrate 10 and the sacrificial layer, forming a first electrode 16, a piezoelectric layer 18 and a second electrode 20 sequentially on the insulator layer 14 and then removing the sacrificial layer by performing wet-etch process through a via hole (not shown). The resulting structure may cause collapse or unwanted delamination during the subsequent process, such as removing the photoresist and slicing the resultant wafer.

Referring to FIG. 1C, in contrast with FIGS. 1A and 1B, it illustrates a FBAR device fabricated according to a reflecting film method, which is also called as Solidly Mounted Resonator (SMR) method. This method comprises depositing reflecting layers 22 and 23 alternatively, of which the acoustic impedance difference is large, and forming a first electrode 16, a piezoelectric layer 18 and a second electrode 20 sequentially thereon. In this method, the difference of acoustic impedances is used to generate large acoustic impedance from the lower part of the device, resulting in separating the resonance region from the substrate. However, in step of depositing reflecting layers 22 and 23 alternatively, each of layer thickness is required to be controlled accurately and have $\lambda/4$ of resonance frequency. Thus, such controlling in SMR is very difficult and time-consuming. Further, the FBAR device according to SMR has lower reflectivity than one according to the air gap method, and has also the problem of reducing effective bandwidth.

Therefore, an improved FBAR device and method have been required to overcome the limitation of the prior methods. The present invention provides a FBAR device and a method of fabricating thereof, having robust structure, good reflectivity and stable effective bandwidth by simplified process.

SUMMARY OF THE INVENTION

It is an object of the present invention to provide a robust FBAR device and a simplified method of fabricating a FBAR device. FBAR device according to the present invention includes a membrane supporting layer between a substrate and a membrane layer surrounding an air gap region. The membrane supporting layer supports the membrane layer to obtain a strong structure.

The method according to the present invention first forms a sacrificial layer on the substrate, then a photoresist pattern is formed on air gap forming region at a top surface of the sacrificial layer, the method removes the sacrificial layer to form a sacrificial pattern by using the photoresist pattern as an etching mask. An insulating material then deposits on the substrate, the photoresist pattern is remove, and a membrane layer is formed on a top surface of the sacrificial layer and the insulating material layer. Finally, the method removes the sacrificial pattern to form air gap.

In an preferred embodiment of the present invention, said step of etching the sacrificial layer may include over-etching the sacrificial layer to form the sacrificial pattern having an undercut and also include controlling the width of the undercut by using dry etch after forming the sacrificial pattern.

In another preferred embodiment of the present invention, the method may further comprise the step of controlling edge profile of the sacrificial pattern by hard baking the photoresist pattern with a hot plate, after forming the photoresist pattern but before forming the sacrificial pattern.

BRIEF DESCRIPTION OF THE DRAWINGS

The present invention will become more fully understood from the detailed description given hereinbelow and the accompanying drawings which are given by way of illustration only, and thus, are not limitative of the present invention and wherein:

FIGS. 2A–2I illustrate cross-sectional structural views exemplary of steps of fabricating a FBAR device in accordance with the present method.

DETAILED DESCRIPTION OF THE INVENTION

Figure 2A:
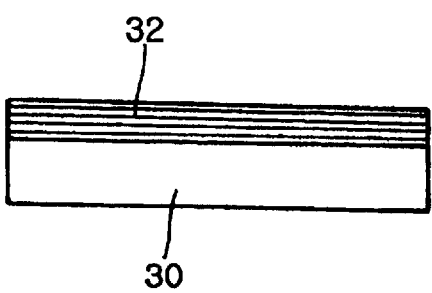
Figure 2B:
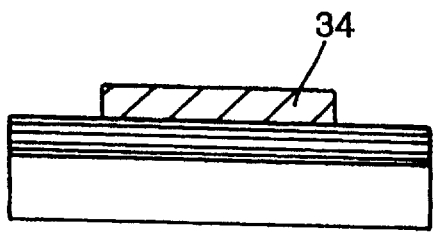
Figure 2C:
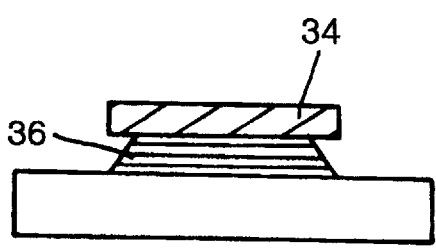

The present invention may be more easily understood with reference to accompanying drawings. FIGS. 2A–2I illustrate cross-sectional structural views exemplary of steps of fabricating a FBAR device in accordance with the present method. FIGS. 2A–2C illustrate particularly the process of forming a sacrificial pattern 36, which is corresponding to an air gap 56 and will then result in forming it.

Referring to FIG. 2A, the present method of a FBAR device begins with forming a sacrificial layer 32 on a substrate 30, which may be typical silicon wafer. The sacrificial layer material may include, but not limited thereto, metal, e.g. Al, Cu and NiFe, or oxide film comprised of ZnO. Deposition method well known in art, such as Sputtering or evaporating method, may be used to deposit the material on the substrate 30, resulting in forming the sacrificial layer 32, but limited thereto.

Referring to FIG. 2B, a photoresist pattern 34 is formed on a portion of the top surface of the sacrificial layer. The photoresist pattern 34 is used to block where to form the sacrificial pattern 36, which will be removed to form an air gap 56 (shown in FIG. 2I) and is preferably formed to have a little larger size than active region of a FBAR device.

Referring to FIG. 2C, using the photoresist pattern 34 as an etching mask, the exposed region of the sacrificial layer is removed to form a sacrificial pattern 36 through wet-etch. It is noted that the sacrificial layer portion below the edge of the photoresist pattern 34 is preferably removed by over-etch process. This is accomplished through controlling the time of the etching. As the result, the sacrificial layer has an undercut.

Also, another step of controlling the width of the undercut may preferably be fulfilled. In this step, the sacrificial pattern 36 become suitable for forming the air gap 56 having a desired spec. the step of controlling the undercut width according to a preferred embodiment of the present invention will be described hereinbelow.

The sacrificial pattern 36 has undercut as described above and has a trapezoid shape when views in cross-section as illustrated in FIG. 2C, it should be known by the skilled in the art that such undercut of the sacrificial pattern 36 allows the photoresist pattern 34 to be removed more easily and prevents from occurring a wing tip. The length from the edge of photoresist pattern 34 to sacrificial pattern 36 is called as an undercut. The width of the undercut is preferably 0.2–3 μm, more preferably 0.5–1 μm.

Figure 2D:
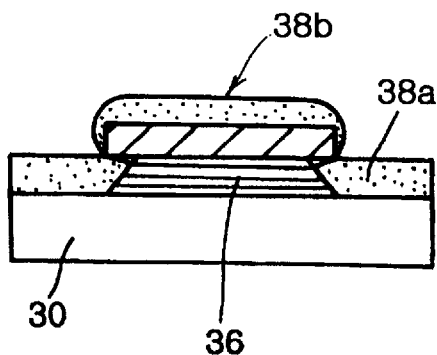
Figure 2E:
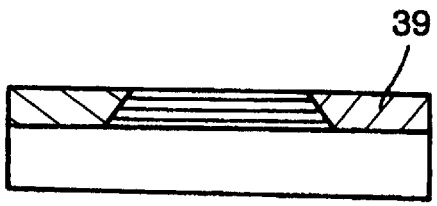

Referring to FIG. 2D, Insulator material 38 is deposited on the entire surface of the resulting substrate 30, on which the sacrificial pattern 36 and the photoresist pattern 34. Subsequently, the photoresist pattern 34 is removed by performing lift-off process, Also, the insulating material 38b on the photoresist pattern 34 is removed along with it, while the insulating material 38a on the substrate 30 is still left as illustrated in FIG. 2E, which is called as a membrane supporting layer 39.

In the present FBAR device, the membrane supporting layer 39 is a layer, which is prepared to support a membrane layer 40 (in FIG. 2F). The insulator material 38a,b may include typical insulating materials known in the art, preferably, such as $SiO_2$ or $Al_2O_3$, but is limited thereto.

Further, in the preferred embodiment of the present invention, it is advantageous that the insulator material may be deposited on the substrate 30 without stripping the photoresist pattern 34 as illustrated in FIG. 2D. The photoresist pattern 34 on the sacrificial pattern 36 is then lift off along with the insulating material thereon. Thus, the photoresist pattern employed in this process can advantageously be used as mask in the step of depositing the insulating material 38a for membrane supporting layer 39 as well as in the step of forming the sacrificial pattern 36. This can simplify the present process and reduce the cost. Also, this process can easily form the membrane supporting layer 39.

In another embodiment of the present invention, after performing wet etch as described above, the width of the undercut may be measured and controlled precisely to range at the determined length. Therefore, the air gap interface can have a desired shape based on the determined length, as well as prevent from occurring wing tip more efficiently.

The thickness of the resulting sacrificial pattern 36 and membrane supporting layer 39 is preferably 0.5–5 μm, and the thickness of the two is not needed to be equal, and the membrane supporting layer 39 has thickness enough to support the membrane layer 40. Also, the surface of the membrane supporting layer 39 may not require so accurate planarity, since it is not in an active area, or a resonance region of the FBAR device. Thus, Polishing process can be omitted in the present method. Therefore, the process according to the present method can be simplified.

Referring to FIG. 2F, The membrane layer 40 is formed on the sacrificial pattern 37 and the membrane supporting layer 39. A membrane layer 40 may be formed according to any deposition method known in the art, such as sputtering and evaporating method. The membrane layer 40 may be formed, for example, by depositing $SiO_2$ layer of about 1 μm thick, or additionally depositing SiN layer of about 0.5 μm thereon. The steps of forming the membrane layer 40 are not limited to the process as described above.

Referring to FIGS. 2G to 2I, a first electrode 42 is formed on the membrane layer 40, a piezoelectric (PZ) material layer 44 is then formed on the first electrode 42, and a second electrode 46 is formed on PZ material layer 44. The first and second electrode material may include any conductive material, such as metal. It is preferably, but limited thereto, selected at least one from the group consisting of Al, W, Au, Pt and Mo, and the PZ material may include typical PZ material, such as AlN and ZnO.

Finally, referring to FIG. 2I, an air gap 56 is formed by removing the sacrificial pattern 36. This may be accomplished by forming at least one via hole, which expose a sacrificial pattern 36 out of FBAR device, and conducting wet etch through the via hole to remove the sacrificial pattern 36, resulting in forming the air gap as a void space between the substrate and the membrane layer. The sacrificial pattern 36 is removed easily, since it comprises a removable material as described above.

In specific embodiment of the present invention, four vial holes is formed in each four corner of the tetragon of the sacrificial pattern as illustrated in FIG. 5. The sacrificial pattern is then removed by performing wet etch process through the four via hole.

As described above, the air gap is sandwiched by the membrane layer 40 and the substrate 30, surrounded by the membrane supporting layer 39. The active area of FBAR device is defined by area overlapping area of the fist electrode, the PZ material layer and the second electrode.

In the fabrication of a FBAR device as describe above, it is preferable that the undercut width may be formed to be within a predetermined range, but depends the employed apparatus and the environment during the process of FBAR fabrication. Therefore, it is problem that the undercut is apt to have too smaller or too larger size than the predetermined according to the difference of the apparatus or the fabrication condition, so that the resulting air gap may not range within a desired spec and wig tip may be occurred, which is disadvantageous to FBAR fabrication.

Figure 3A:
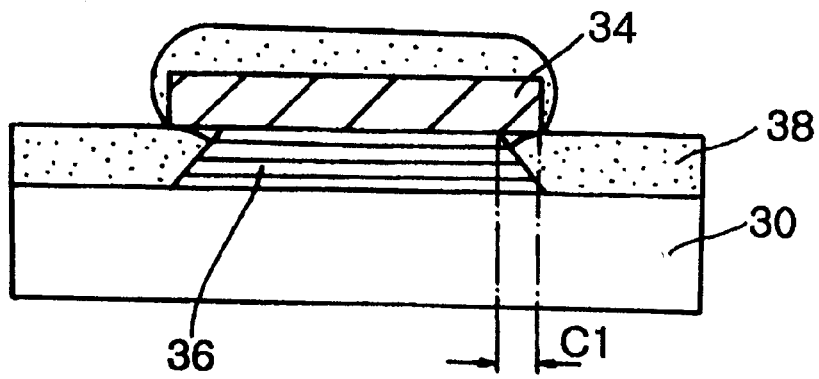
FIGS. 3A–3C illustrate cross-sectional structural views exemplary of insulator material layer formation to define membrane supporting layer shape according to undercut shape in the present invention.
Figure 3B:
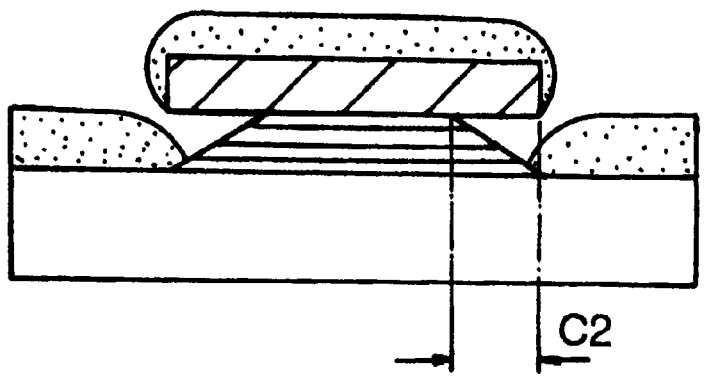

Further, FIGS. 3A–B illustrates the shape of the deposited insulating material for forming the membrane supporting layer 39. In a preferred embodiment, after the step of etching to obtain the predetermined undercut width (C1), insulator material is deposited as illustrated in FIG. 3A. On forming the insulating material layer in this manner, then the photoresist pattern 34 can be removed easily by lift-off process.

Figure 3C:
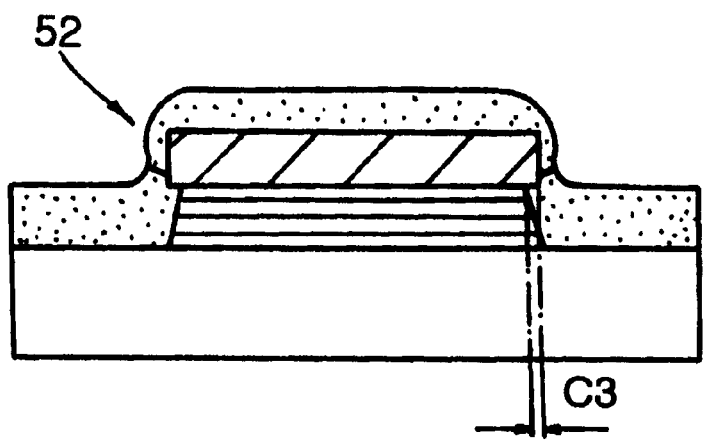

However, if the undercut width (C2) is larger than the desired range and the insulating material 38 is deposited in the same condition as the process of FIG. 3A, then the shape of the insulating material layer 38 is obtained as illustrated in FIG. 3B. Thus, the insulating material cannot be deposited enough to reach to the sacrificial pattern 36. In the contrast, if the undercut width (C3) is below the desired range, the insulator material is deposited in the same condition as the process of FIG. 3A, resulting in forming the insulator material layer 38 as illustrated in FIG. 3C. Thus, the insulating material layer 38 may be formed connecting the portion on the photoresist pattern 34 and the portion on the substrate. On the removal of the photoresist pattern, a wing tip may be occurred due to cracking, etc, which includes a protrusion from the edge of the membrane supporting layer.

To overcome these problems, in another embodiment of the present invention, an optional step may be added to the fabrication method as described above. After forming the sacrificial pattern by wet etch process, the additional step of controlling the undercut width may be fulfilled by dry etch process. The said step may include measuring the undercut width and then controlling dry etching time according to the measured width. The dry etch process may include reactive ion etch process (RIE).

Referring to FIGS. 4A–4D, the steps of controlling the undercut width are sequentially illustrated according to the preferred embodiment.

Figure 4A:
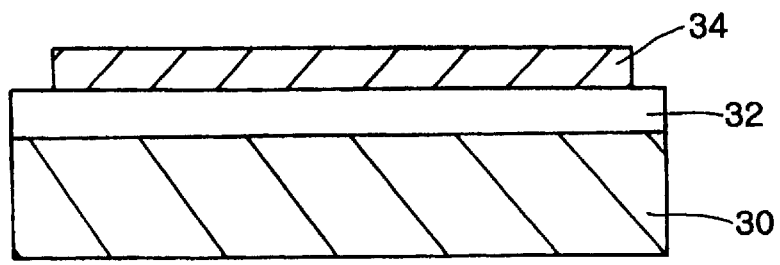
FIGS. 4A–4D illustrate cross sectional views exemplary of the process of controlling the undercut shape in accordance with a preferred embodiment of the present invention.

FIG. 4A is a cross sectional view of the structure having the photoresist pattern 34 on a portion of the sacrificial layer 32 as illustrated in FIG. 2B. the photoresist pattern 34 may undergo the loss of the thickness by performing RIE for controlling the width of the undercut, since the edge profile of the photoresist 34 has a steep slope. For example, The loss of about 1 $\mu$m thickness is followed by reducing about 1 $\mu$m width of undercut. Therefore, the present invention can employ the typical process of a) photoresist pattern formation, b) hard-baking and c) wet etching the sacrificial pattern. More specifically describing, the hard-backing may be performed using typical hot plate for 1–10 min, at 130–200° C., after forming photoresist pattern, but before wet-etching.

Figure 4B:
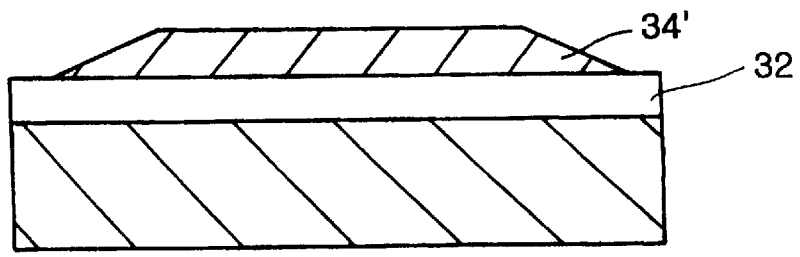

Referring to FIG. 4B, the resulting edge profile of the photoresist pattern 34' has a gentle slop and the thickness of the edge portion is shallow. The exposed portion of the sacrificial layer 32 is removed by wet-etching as described above.

Figure 4C:
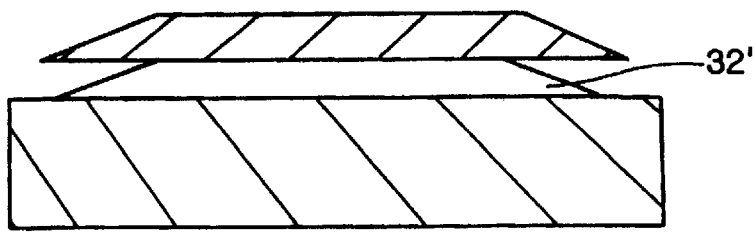

Referring to FIG. 4C, the sacrificial pattern 32' has an undercut obtained by wet etching. The undercut width is measured and determined whether it is within the desired range. If the undercut width is not reached at the range, RIE is used to obtain the undercut width within the desired range. This step is controlling the undercut. The step of controlling the width of the undercut may be accomplished by controlling a RIE time, which is calculated based on difference of the desired width and the actually measured width.

Figure 4D:
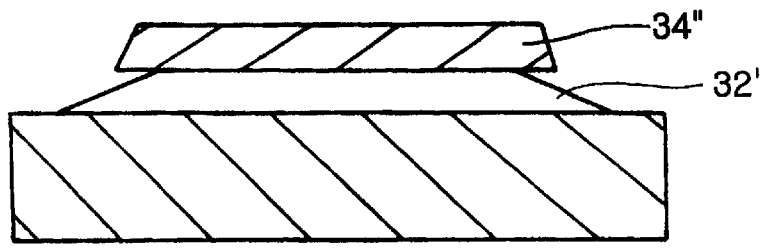

FIG. 4D illustrates the resulting undercut of the sacrificial pattern 32' on the substrate 30. By controlling the undercut as described above, the loss of thickness of the photoresist pattern 34" is reduced to about ⅓. In the application to mass production, the automatic apparatus known in the art can be used to measure the undercut width and control the RIE time.

In contrast, the prior process of forming a sacrificial layer for an air gap includes the steps of forming a depression on the substrate and depositing polysilicon glass (PSG) in the depression. But, this process requires a subsequent step of chemical mechanical polishing (CMP), which is tedious and complex process, since the surface of the PSG layer has poor planarity. Further, this process requires the additional step of forming a buffer layer (e.g. comprising $SiO_2$) between Si substrate and the PSG, which prevent the phosphorus ion of PSG from diffusing into the substrate.

In the present method of fabricating the sacrificial pattern for air gap, as described above, the sacrificial pattern, including the active area, is formed by depositing a metal or ZnO, which can obtain a good planar top surface. Thus, the CMP employed in conventional method can be omitted, therefore the desired planarity of the active area can be achieved easily by the simplified process.

Figure 5A:
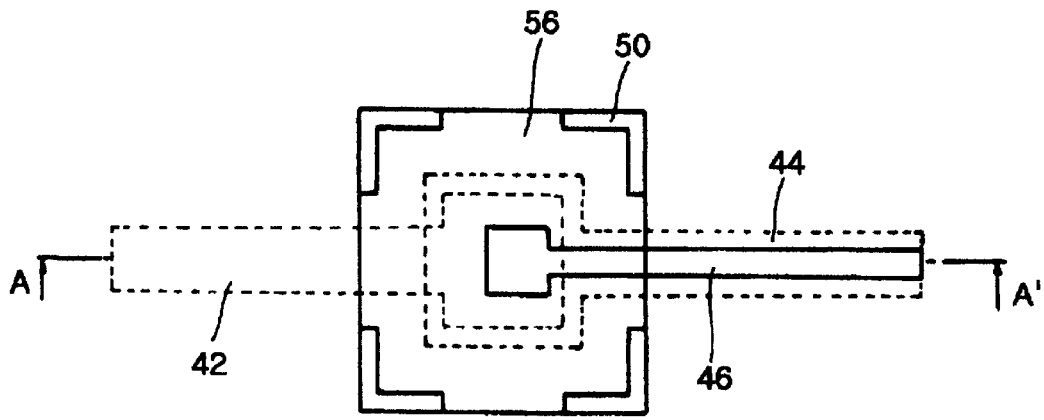
FIG. 5A illustrates a plan view exemplary of the FBAR device structure according to the present invention.
Figure 5B:
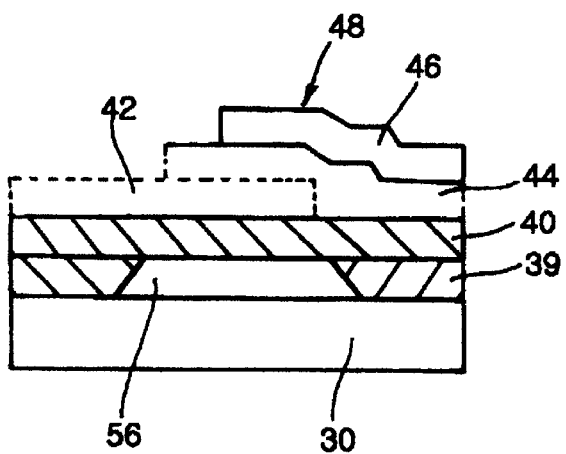
FIG. 5B illustrates a cross sectional view exemplary of the FBAR device structure in accordance with the present invention.

Referring to FIGS. 5A and 5B, FIG. 5A illustrates a plan view exemplary of the FBAR device structure and FIG. 5B illustrates a cross sectional view exemplary of the FBAR device structure in accordance with the present invention.

A FBAR device according to the present invention comprises a substrate 30, a membrane supporting layer 39 on the substrate 30 surrounding a air gap 56, wherein the air gap have a top surface substantially coplanar with a surface of the membrane layer, a membrane layer 40 on the air gap 56 and the membrane supporting layer 38, a first electrode 42 on the membrane layer 40, a piezoelectric layer 44 on the first electrode 42, and a second electrode 46 on the piezoelectric layer 44.

The air gap structure will be described now. A bottom surface of the air gap comprises a portion of a top surface of the substrate, a lateral surface of the air gap comprises the membrane supporting layer, and a top surface of the air gap comprises a portion of a bottom surface of the substrate.

One of the important features of the present invention is an air gap having a robust structure by the membrane supporting layer on the substrate surrounding the air gap thereon.

Figure 1A:
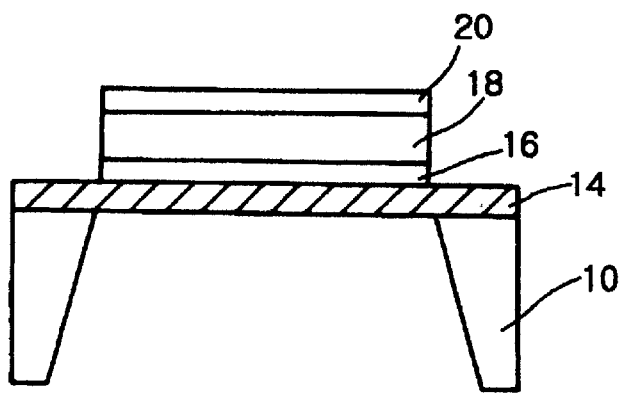
FIGS. 1A–1C illustrate cross-sectional structural views exemplary of a FBAR device structure in accordance with the prior method.
Figure 1B:
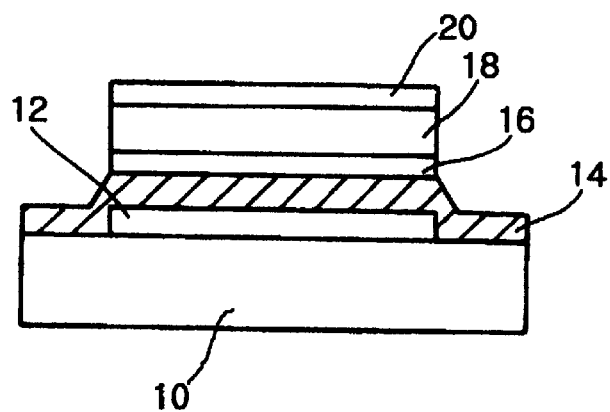
Figure 1C:
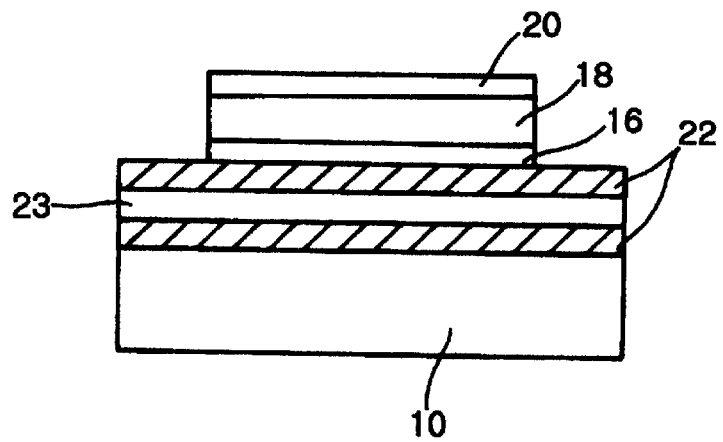

In the prior FBAR device, a membrane layer is fragile on edge portion of the air gap, which is thinner than the other as illustrated in FIG. 1B. Thus, the air gap has weak structure, and therefore it may cause collapse or delamination during the photoresist removal or the other processing. But, the present invention provide the membrane supporting layer to support the membrane layer stably, resulting in preventing the problems as described above.

In the present invention, a photoresist for lift-off is used to form the photoresist pattern for forming the sacrificial pattern, and the sacrificial pattern have undercut, therefore, it may not cause wing-tip after lift-off process.

As described above, the present invention provide a robust FBAR device by forming the membrane supporting layer surrounding an air gap, which is an isolation to block the substrate effect to a resonance region.

According to the present invention, the photoresist pattern used in the step of forming the membrane supporting layer is not remove and is used in step of forming the sacrificial pattern. It can omit polishing step employed in prior method, such as CMP, therefore the present invention method can be simplified and have good reproducibility.

While the invention has been described in its preferred embodiments, this should not be construed as limitation on the scope of the present invention. Accordingly, the scope of the present invention should be determined not by the embodiments illustrated, but by the appended claims and their legal equivalents.

What is claimed is:

1. A method for fabricating a film bulk acoustic resonator (FBAR) device having air gap, comprising steps of:

forming a sacrificial layer on a substrate;

forming a photoresist pattern on a portion of an upper surface of the sacrificial layer;

forming a sacrificial pattern by etching the sacrificaial layer by using the photoresist pattern as an etching mask;

depositing an insulating material on the substrate;

forming a membrane supporting layer on sides of the sacrificial pattern by eliminating the insulating material and the photoresist pattern on the sacrificial pattern so that the sacrificial pattern and the insulating material have the same height;

forming a membrane layer on the sacrificial pattern and the membrane supporting layer;

forming a first electrode on the membrane layer;

forming a piezoelectric layer on the first electrode;

forming a second electrode on the piezoelectric layer; and removing the sacrificial pattern to form the air gap.

2. The method according to claim 1, wherein said step of forming a sacrificial pattern includes the step of over-etching the sacrificial layer so that sides of the sacrificial pattern have an undercut structure.

3. The method according to claim 2, wherein the step of over-etching the sacrificial layer further comprise the step of controlling the width of the undercut structure after the step of over-etching the sacrificial layter.

4. The method according to claim 3, wherein the step of controlling the width of the undercut structure is performed by using reactive ion etching (RIE) process.

5. The method according to claim 3, further comprising the step of controlling edge profile of the photoresist pattern by using hard-baking process for 1–10 min, at 130–200° C. on a hot plate, after the step of forming a photoresist pattern.

6. The method according to claim 2, wherein the width of the undercut is approximately 0.2–3 $\mu$m.

7. The method according to claim 1, wherein the thickness of the sacrificial pattern is approximately 0.5–5 $\mu$m.

8. The method according to claim 1, the step of removing the sacrificial pattern to forming air gap includes the steps of:

forming at least one via hole to expose the sacrificial pattern out of FBAR device; and wet-etching the sacrificial pattern through said at least one via hole.

9. The method according to claim 8, the step of wet-etching the sacrificial layer includes the step of wet-etching the sacrificial pattern with $HNO_3$ as an etchant.

10. The method according to claim 8, wherein said at least one via hole is formed in at least one corner of the sacrificial pattern.

11. A method according to claim 1, the sacrificial layer comprises a material selected from the group consisting of Al, Cu, NiFe and ZnO.

12. A method according to claim 1, the insulating material includes a material selected from the group consisting of $SiO_2$, SiN and $Al_2O_3$.

13. A method according to claim 1, the piezoelectric layer includes AlN or ZnO.

\* \* \* \* \*